United States Patent [19]
Yeh

[11] Patent Number: 5,410,185
[45] Date of Patent: Apr. 25, 1995

[54] INTERNAL BRIDGING CONTACT

[76] Inventor: Jenn L. Yeh, 12091 Plumas Dr., Saratoga, Calif. 95070

[21] Appl. No.: 170,659

[22] Filed: Dec. 20, 1993

Related U.S. Application Data

[63] Continuation of Ser. No. 936,973, Aug. 28, 1992, abandoned, which is a continuation of Ser. No. 716,050, Jun. 17, 1991, Pat. No. 5,169,802.

[51] Int. Cl.$^6$ .............................................. H01L 23/48
[52] U.S. Cl. .................... 257/776; 257/758; 257/774
[58] Field of Search ............... 257/776, 296, 276, 522, 257/774, 758

[56] References Cited

U.S. PATENT DOCUMENTS

| | | | |
|---|---|---|---|
| 3,693,251 | 9/1972 | Jaccodine | 257/776 |
| 4,758,306 | 7/1988 | Cronin et al. | 257/506 |
| 4,789,648 | 12/1988 | Chow et al. | 437/228 |
| 4,801,560 | 1/1989 | Wood et al. | 437/195 |
| 4,808,552 | 2/1989 | Anderson | 257/760 |
| 4,832,789 | 5/1989 | Cochran et al. | 437/228 |
| 4,840,923 | 6/1989 | Flagello et al. | 437/189 |
| 4,900,695 | 2/1990 | Takahashi et al. | 257/750 |
| 4,984,055 | 1/1991 | Okumura et al. | 257/296 |
| 5,026,665 | 6/1991 | Zdebel | 437/228 |
| 5,091,339 | 2/1992 | Carey | 437/228 |
| 5,110,712 | 5/1992 | Kessler et al. | 437/228 |
| 5,162,258 | 11/1992 | Lemnios et al. | 257/296 |
| 5,169,802 | 12/1992 | Yeh | 437/195 |

FOREIGN PATENT DOCUMENTS

| | | | |
|---|---|---|---|
| 0279752 | 8/1988 | European Pat. Off. | 437/203 |
| 61-237448 | 10/1986 | Japan | 437/203 |

OTHER PUBLICATIONS

Yeh et al., "Reverse Pillar and Maskless Contact-Two Novel Recessed Metal Schemes and Their Comparisons to Conventional VLSI Metallization Schemes," IEEE, Jun. 1988, pp. 95-100.

Primary Examiner—Sara W. Crane
Assistant Examiner—Courtney A. Bowers

[57] ABSTRACT

A bridging contact between internal contacts in a semiconductor integrated circuit is formed which is insulated from any connection to an intervening feature. A first dielectric layer is deposited over the contacts and the intervening feature, followed by an etch stop layer. The etch stop layer is patterned to form an etch stop mask and a second dielectric layer is deposited over the first dielectric layer and the patterned etch stop. The first and second dielectric layers are etched to form a trench opening and a pair of communicating passageways in the dielectric layers which expose the internal contacts. The etch stop mask protects and controls the vertical and horizontal dimensions of the resultant dielectric insulator that protects the intervening feature. Metal is deposited in the opening and passageways to form a bridging contact between the contacts. The bridging contact is electrically isolated from the intervening feature by the dielectric insulator remaining over and around the intervening feature.

5 Claims, 2 Drawing Sheets

INTERNAL BRIDGING CONTACT

CROSS REFERENCE TO RELATED APPLICATIONS

This is a continuation of application Ser. No. 07/936,973, filed on Aug. 28, 1992, now abandoned, which is a continuation of Ser. No. 07/716,050, filed on Jun. 17, 1991, U.S. Pat. No. 5,169,802.

BACKGROUND OF THE INVENTION

1. Field of the Invention

This invention generally relates to the formation of internal electrical connections in semiconductor integrated circuits and more particularly to internal bridging contacts formed at the submicrometer level insulated from an intervening conductive feature.

2. Description of the Prior Art

As the density of very large scale integrated, or VLSI, circuits continues to increase, the formation of features and electrical connections between such features becomes more difficult. I and others in U.S. Pat. No. 4,832,789 and IEEE Proceedings V-MIC Conference, pp. 95–100, Jun. 13–14, 1988, have disclosed techniques which include an approach for forming a self-aligning internal interconnecting bridging contact which may be used at the submicrometer level.

The disclosed approach creates a shallow trench and connecting passageways. The passageways extend through layers of the VLSI circuit to contact points on the surface of a substrate. The trench and passageways are filled with metal to form a bridging contact between the contact points. This approach may be utilized to connect conductive runners or other contact points separated by intervening conductive features, such as a transverse runner. In this disclosed approach, a dielectric is deposited on the substrate covering all the runners, two passageways connected by a shallow trench are etched through the dielectric to the runners to be connected, and metal is deposited into the passageways and trench completing the bridging contact.

In particular, the dielectric layer is deposited on the substrate followed by an etch stop layer deposited on the dielectric layer. A layer of photoresist is applied to the etch stop layer, exposed in a predetermined pattern and developed. After removal of the unexposed photoresist, a photoresist pattern remains on the etch stop above the runners to be connected. The photoresist pattern is then etched away together with the exposed etch stop and a portion of the dielectric to form a trench in the dielectric, positioned over and larger in width than the transverse runner. Another layer of photoresist is then applied and patterned in the trench over an area only slightly larger than the transverse runner.

A second etching removes the remaining exposed portions of the trench down to the substrate, creating two passageways to the runners to be connected, while leaving dielectric over and around the transverse runner. The trench and passageways are filled with metal to form a bridging contact between the runners without contacting the transverse runner. Excess metal above the surface of the trench and the remainder of the etch stop layer is then etched to form a planarized surface with the dielectric, if desired.

One benefit of this known approach is that the passageways are self-aligning with the runners to be connected. However, it is difficult to sufficiently and accurately control the etching process to leave an adequate amount of dielectric over and around the transverse runner to act as an insulator. Too short an etch will not expose the runners to be connected while too long an etch will expose the transverse runner. It is also difficult to apply and pattern photoresist in the trench. The lithographic process used to pattern photoresist does not always work well in such small subsurface areas, particularly in areas with high aspect ratios.

What is needed is a technique which retains the self-aligning feature, and many of the other advantages of my former approach, while providing improved control over the second etching process. The needed technique must reliably expose runners or other contact points on the substrate while avoiding the inadvertent exposure of any intervening features. In addition, the technique should avoid the need to pattern photoresist in non planar features and/or at subsurface levels.

SUMMARY OF THE INVENTION

The preceding and other shortcomings of the prior art are addressed and overcome by the present invention which improves my former approach by controlling the horizontal and vertical dimensions of the resultant dielectric insulator around the intervening feature with an etch stop mask formed in between a pair of dielectric layers. A bridging contact is formed between two runners, or other contact points on the surface of a substrate, while avoiding contact or connection with intervening conductive features, such as a transverse runner. The bridging contact is formed by deposition in passageways and a communicating opening, such as a trench, around and over the transverse runner.

The passageways and the trench are etched while maintaining a predetermined amount of dielectric over and around the transverse runner. The dielectric over and around the transverse runner is protected during the etching by a patterned etch stop layer. The invention retains the self aligning feature of my former technique and permits all photoresist patterning to be performed on essentially planar surfaces.

In one aspect, the invention provides a method of forming a bridging contact in a semiconductor integrated circuit between a pair of contacts on an internal layer separated by an intervening feature by depositing a first dielectric layer on the surface of the internal layer, said first dielectric layer covering the contacts and the intervening feature, forming a pattern of etch stop on the first dielectric layer related to the intervening feature, depositing a second dielectric layer over the first dielectric layer and the pattern of etch stop, etching the first and second dielectric layers to form an opening in the second dielectric layer exposing the etch stop pattern and communicating with a pair of passageways formed in the first dielectric layer exposing the contacts, and depositing metal in the opening and passageways to form a bridging contact between the contacts.

These and other features and advantages of this invention will become further apparent from the detailed description that follows which is accompanied by one or more drawing figures. In the figures and description, numerals indicate the various features of the invention, like numerals referring to like features throughout both the drawings and the description.

DETAILED DESCRIPTION OF A PREFERRED EMBODIMENT

Figure 1:
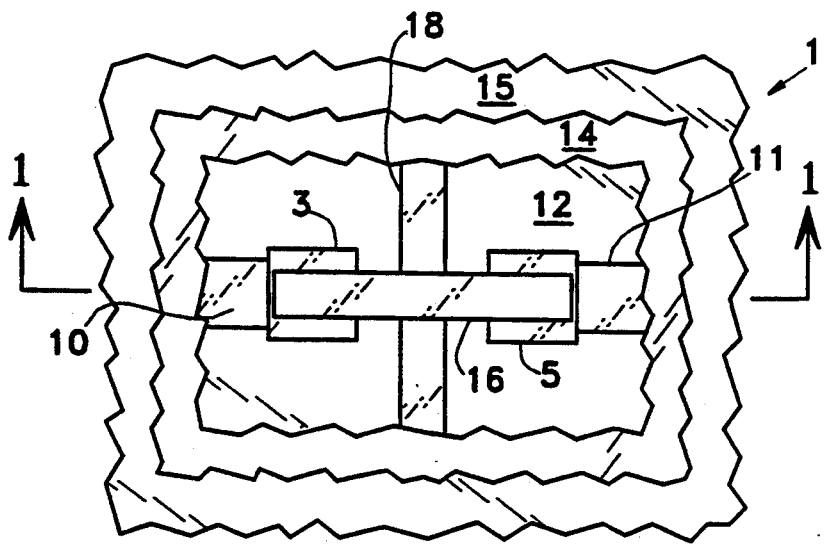
FIG. 1 is top plan view of a portion of a semiconductor integrated circuit, partially cut away in a stepped fashion along step lines BB shown in FIG. 2, showing a bridging contact between and connecting two conductive runners without interconnection to an intervening conductive transverse runner.
Figure 2:
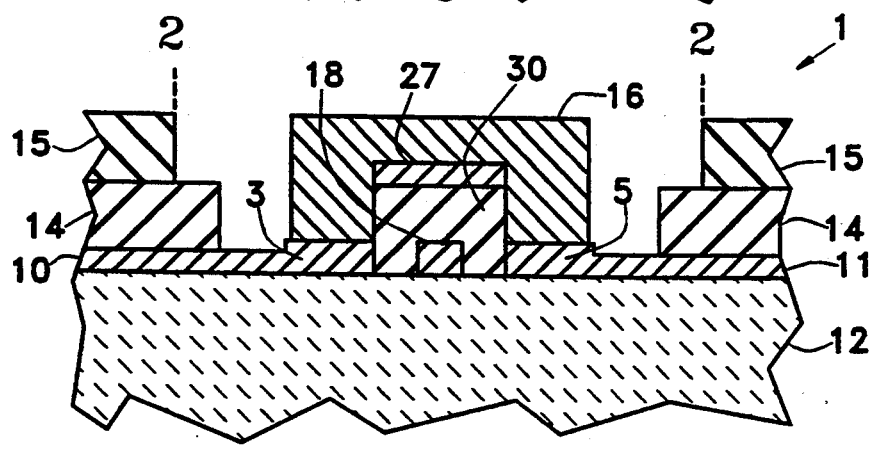
FIG. 2 is a sectional view of the integrated circuit shown in FIG. 1 taken along line AA.

FIG. 1 shows a stepped, partially cut away top plan view of semiconductor integrated circuit 1, an assembly having submicrometer components. FIG. 2 is a sectional view of integrated circuit 1, taken along line AA of FIG. 1. The stepped partially cut away view of FIG. 1 has been taken along step lines BB shown in FIG. 2 to expose internal contact pads 3 and 5, runners 10 and 11 and transverse runner 18 on substrate 12 as well as bridging contact 16, all as explained below in greater detail.

Referring now to both FIGS. 1 and 2, integrated circuit 1 includes a pair of internal contact pads 3 and 5, at connection points on conductive features, such as conductive runners 10 and 11, respectively, located on the surface of an internal layer, shown as substrate 12. Runners 10 and 11 are separated by an intervening feature, such as transverse runner 18, which may be another conductive feature such as a runner or contact pad. In accordance with the present invention, bridging contact 16 connects runners 10 and 11 without making electrical or physical contact with transverse runner 18.

Figure 8:
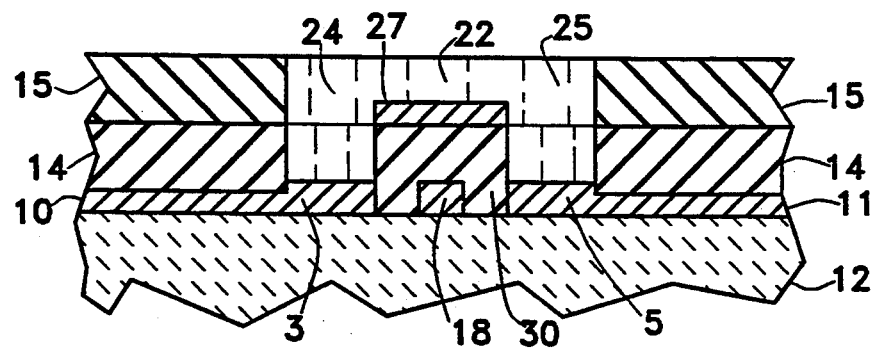
FIG. 8 is the structure shown in FIG. 7 after etching a trench and passageways to the runners.
Figure 9:
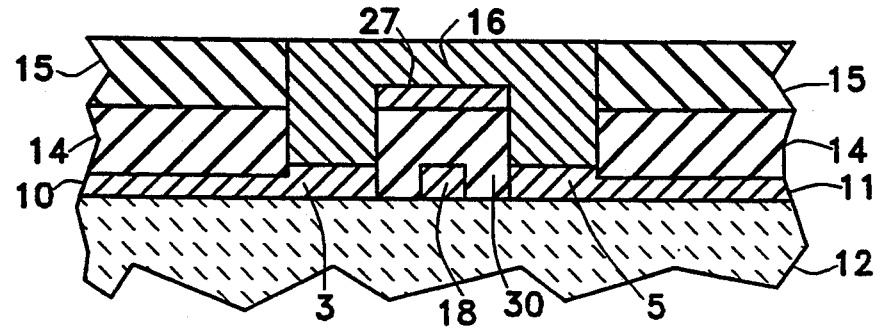
FIG. 9 is the structure shown in FIG. 8 after deposition of metal in the trench and passageways.

As shown in greater detail in FIGS. 8 and 9, bridging contact 16 is formed by deposition of a conductive material, such as a metal filing, in trench 22 and passageways 24 and 25 which are formed by etching away portions of dielectric layers 14 and 15. The etching may be accomplished by any conventional technique, including my former approach.

A primary difference from my former technique, however, is the way the dielectric layer or layers are masked during the etching process. In my previous technique, a patterned portion of photoresist was used to protect a single dielectric layer of insulation over and around transverse runner 18. In the present invention, etch stop pattern 27, a patterned portion of etch stop layer 26, is used to more precisely control the configuration and dimensions of dielectric insulator 19 during fabrication.

Using an etch stop mask such as etch stop pattern 27, to protect transverse runner 18, significantly broadens the allowable parameters of the final etch of dielectric layers 14 and 15 down to runners 10 and 11. If the final etch removes too much dielectric material because of the intensity of the etch or the length of time of the etch, the desired height of the dielectric over transverse runner 18, that is, the vertical height of dielectric insulator 30, is maintained by the patterned portion of etch stop layer 26, that is, etch stop pattern 27.

In addition, the amount of dielectric remaining around transverse runner 18, that is the horizontal dimension of dielectric insulator 30, is better controlled than in my former approach by use of an etch stop mask, such as etch stop pattern 27.

FIGS. 3 through 9 are sectional views of integrated circuit 1 taken along line AA of FIG. 1 in the same manner as FIG. 2. These figures depict the various stages during the fabrication of integrated circuit 1.

Figure 3:
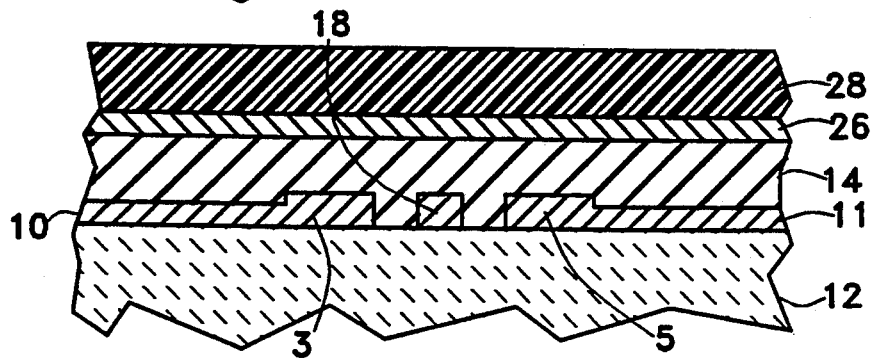
FIG. 3 is a sectional view taken along line AA of FIG. 1, showing the initial structure after deposition of a first dielectric layer, an etch stop layer and a first photoresist layer.

Referring now to FIG. 3, first dielectric layer 14 is deposited on substrate 12, covering runners 10 and 11, internal contact pads 3 and 5, and transverse runner 18. Substrate 12 may be a silicon wafer or other semiconductor material suitable for use as an internal layer or support base of an integrated circuit.

Internal contact pads 3 and 5 and transverse runner 18 are shown as having a larger vertical dimension than runners 10 and 11 for clarity of illustration of a worst case problem, though the relative vertical dimensions are not critical. First dielectric layer 14, as well as second dielectric layer 15, as described below, may be configured from any standard semiconductor nonconducting material, such as a dielectric layer of an oxide or nitride of silicon.

Etch stop layer 26 is deposited on first dielectric layer 14. Etch stop layer 26 may be a conventional insulating layer and is deposited using techniques well known in the art.

Figure 4:
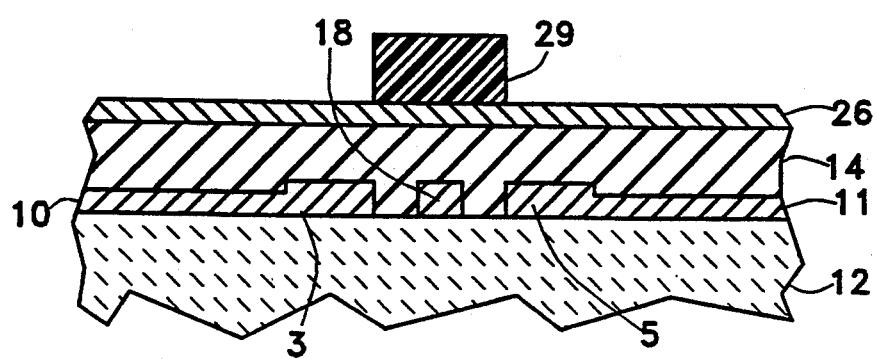
FIG. 4 is the structure shown in FIG. 3 after patterning of the first photoresist layer.
Figure 5:
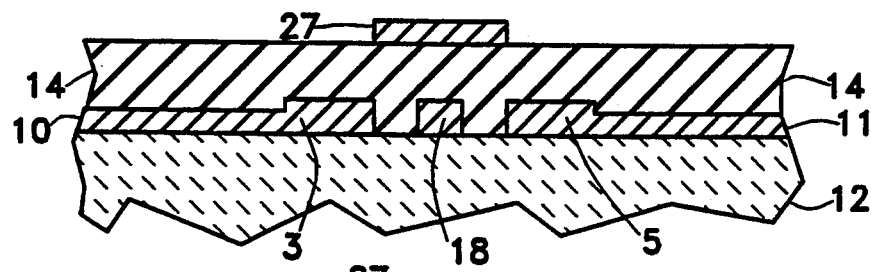
FIG. 5 is the structure shown in FIG. 4 after etching of the etch stop layer.

Referring additionally now to FIGS. 4 and 5, etch stop layer 26 is patterned to form etch stop pattern 27 in accordance with conventional techniques. Etch stop pattern 27 will provide the desired masking function over transverse runner 18 during a subsequent etching process, described below.

Etch stop pattern 27 shown in FIG. 5 is formed by depositing photoresist layer 28 on etch stop layer 26, then masking, exposing and developing photoresist layer 28 to form photoresist pattern 29, as shown in FIG. 4. An etching process is applied to etch stop layer 26 and photoresist pattern 29, using conventional techniques, to form etch stop pattern 27. The shape of photoresist pattern 29 and hence the resultant etch stop pattern 27, is the shape required for forming dielectric insulator 30 over and around transverse runner 18, as may be seen in FIG. 8.

Figure 6:
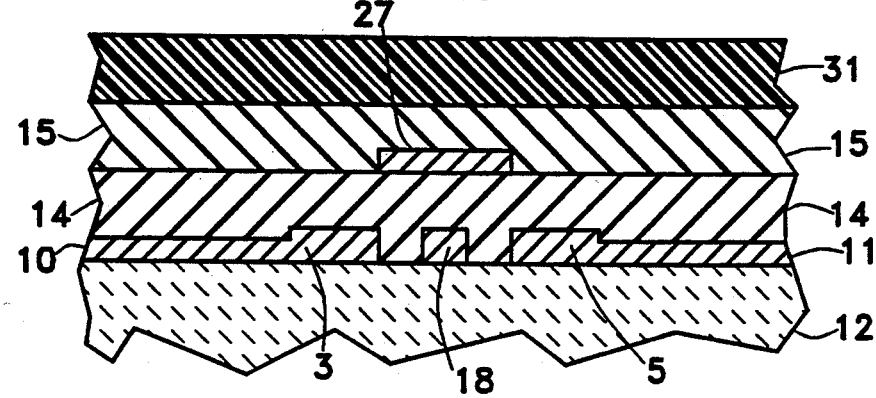
FIG. 6 is the structure shown in FIG. 5 after deposition of a second dielectric layer and a second photoresist layer.

Referring now to FIG. 6, after the etching of etch stop layer 26 is completed, photoresist pattern 29 is stripped away and second dielectric layer 15 is deposited over dielectric layer 14 and etch stop pattern 27. Second photoresist layer 31 is then deposited over second dielectric layer 15.

Figure 7:
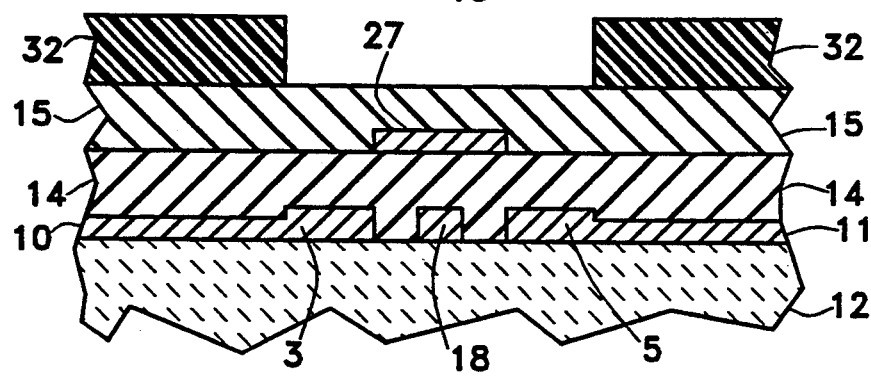
FIG. 7 is the structure shown in FIG. 6 after patterning of the second photoresist layer.

Second photoresist layer 31 is masked, exposed, and developed to produce photoresist pattern 32, as shown in FIG. 7. Photoresist pattern 32 exposes the portion of second dielectric layer 15 in which bridging contact 16 will be formed.

As shown in FIG. 8, a second etching is performed to form a series of openings and/or passageways, such as trench 22 in second dielectric layer 15 and passageways 24 and 25 in first dielectric layer 14. Trench 22 is located between the top surface of second dielectric layer 15 and etch stop pattern 27. Passageways 24 and 25 are located between the top surface of second dielectric layer 15 and internal contact pads 3 and 5.

Referring now to FIG. 9, metal is deposited in trench 22 and passageways 24 and 25 to form bridging contact 16. Bridging contact 16 electrically interconnects runners 10 and 11 while avoiding contact with transverse runner 18. Several techniques may be used for forming bridging contact 16. For example, tungsten or other refractory metals may be deposited by either selective or blanket chemical vapor deposition.

For selective deposition, a photoresist pattern similar to photoresist pattern 32 shown in FIG. 7 is patterned on the surface of second dielectric layer 15 leaving trench 22 and passageways 24 and 25 exposed. Metal is deposited in trench 22 and passageways 24 and 25, and the photoresist is then stripped away completing the process.

For non-selective deposition, a layer of metal is deposited in trench 22 and passageways 24 and 25, as well as over at least a portion of the surface of second dielectric layer 15. A uniform etchback is then performed to remove the metal on the surface of second dielectric layer 15 and to planarize the surface of bridging contact 16 with the surface of second dielectric layer 15, completing the process.

The present invention's use of etch stop pattern 27 above transverse runner 18 allows the vertical height of dielectric insulator 30 to be reliably controlled during the second etching step. The predetermined shape of etch stop pattern 27 reliably forms the desired shape of dielectric insulator 30, maintaining the desired horizontal width of dielectric insulator 30 to provide the requisite amount of dielectric between transverse runner 18 and bridging contact 16.

In accordance with the present process, bridging contact 16 is self aligning with respect to runners 10 and 11 and all photoresist lithography is conveniently performed on essentially planar surfaces.

While this invention has been described with reference to its presently preferred embodiment, its scope is not limited thereto. Rather, such scope is only limited insofar as defined by the following set of claims and all equivalents thereof.

What is claimed is:

1. A semiconductor integrated circuit including a bridging contact between a pair of contacts located on an internal layer and separated by an intervening feature, the bridging contact formed by the steps of:

depositing a first dielectric layer on a surface of the internal layer, said first dielectric layer covering the contacts and the intervening feature;

forming an etch stop pattern on the first dielectric layer over the region related to the intervening feature;

depositing a second dielectric layer over the first dielectric layer and the etch stop pattern;

etching the first and second dielectric layers to form a communicative opening between a first and second passageway in the second dielectric layer exposing the etch stop pattern and to form the first and second passageway through the second dielectric layer and the first dielectric layer exposing each of the contacts respectively, wherein a first sidewall of the first passageway in the first dielectric layer is coplanar with a first sidewall of the first passageway in the second dielectric layer and a first sidewall of the second passageway in the first dielectric layer is coplanar with a first sidewall of the second passageway in the second dielectric layer; and depositing metal in the communicative opening and the first and second passageways to form the bridging contact between the contacts.

2. The semiconductor integrated circuit recited in claim 1 wherein a second sidewall of the first passageway in the first dielectric layer is coplanar with a first sidewall of the etch stop pattern and a second sidewall of the second passageway in the first dielectric layer is coplanar with a second sidewall of the etch stop pattern.

3. The semiconductor integrated circuit recited in claim 2 wherein the second sidewall of the first passageway in the first dielectric layer is opposite to the first sidewall of the first passageway in the first dielectric layer and the second sidewall of the second passageway in the first dielectric layer is opposite to the first sidewall of the second passageway in the first dielectric layer.

4. The semiconductor integrated circuit recited in claim 3 wherein the first and second passageways include four sidewalls in the first dielectric layer, wherein three of the four sidewalls are coplanar with the sidewalls of the first and second passageways in the second dielectric layer and the remaining sidewall of the first and second passageways in the first dielectric layer are coplanar with the first and second sidewalls of the etch stop pattern.

5. The semiconductor integrated circuit recited in claim 1, wherein the semiconductor integrated circuit is a VLSI device.

* * * * *